(12) United States Patent
Lee et al.

(10) Patent No.: US 9,257,615 B2
(45) Date of Patent: Feb. 9, 2016

(54) LIGHT EMITTING DEVICE PACKAGE AND METHOD OF MANUFACTURING THE SAME

(71) Applicant: Samsung Electronics Co., Ltd., Seoul (KR)

(72) Inventors: Young Ki Lee, Hwaseong (KR); Seog Moon Choi, Seoul (KR); Hyung Jin Jeon, Gunpo (KR); Sang Hyun Shin, Hwaseong (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 379 days.

(21) Appl. No.: 13/625,517

(22) Filed: Sep. 24, 2012

(65) Prior Publication Data

US 2013/0026901 A1 Jan. 31, 2013

Related U.S. Application Data

(62) Division of application No. 12/213,241, filed on Jun. 17, 2008, now Pat. No. 8,299,692.

(30) Foreign Application Priority Data

Apr. 28, 2008 (KR) .................. 10-2008-0039277

(51) Int. Cl.
*H05B 33/02* (2006.01)
*H01L 33/48* (2010.01)
(Continued)

(52) U.S. Cl.
CPC ............ *H01L 33/486* (2013.01); *H01L 33/647* (2013.01); *H01L 33/62* (2013.01); *H01L 2224/48227* (2013.01)

(58) Field of Classification Search
CPC .................................. F21W 2131/406
USPC ........... 257/99, 88, 93; 313/46, 498, 499–512
See application file for complete search history.

(56) References Cited

U.S. PATENT DOCUMENTS

2004/0012958 A1 1/2004 Hashimoto et al.
2006/0246617 A1 11/2006 Lee et al.
(Continued)

FOREIGN PATENT DOCUMENTS

CN 1855561 A 11/2006
EP 1 398 839 3/2004
(Continued)

OTHER PUBLICATIONS

Korean Office Action issued in Korean Patent Application No. KR 10-2008-0039277 dated Mar. 31, 2010.
(Continued)

*Primary Examiner* — Nimeshkumar Patel
*Assistant Examiner* — Jacob R Stern
(74) *Attorney, Agent, or Firm* — McDermott Will & Emery LLP

(57) ABSTRACT

The present invention relates to a light emitting device package and a method of manufacturing the same. There is provided a light emitting device package including a metal core; an insulating layer formed on the metal core; a metal layer formed on the insulating layer; a first cavity formed by removing parts of the metal layer and the insulating layer to expose a top surface of the metal core; and a light emitting device directly mounted on the top surface of the metal core in the first cavity and further there is provided a method of manufacturing the light emitting device package.

28 Claims, 7 Drawing Sheets

(51) Int. Cl.
  *H01L 33/64*   (2010.01)
  *H01L 33/62*   (2010.01)

(56) References Cited

U.S. PATENT DOCUMENTS

| | | | |
|---|---|---|---|
| 2007/0126093 A1* | 6/2007 | Ho et al. | 257/675 |
| 2007/0217221 A1 | 9/2007 | Lee et al. | |
| 2007/0235743 A1* | 10/2007 | Lee et al. | 257/81 |
| 2007/0246715 A1 | 10/2007 | Shin et al. | |

FOREIGN PATENT DOCUMENTS

| | | |
|---|---|---|
| EP | 1 443 809 A3 | 8/2004 |
| JP | 2004-241416 A | 8/2004 |
| JP | 2006-310584 A | 11/2006 |
| JP | 2006-310584 A | 11/2006 |
| JP | 2006-319074 A | 11/2006 |
| JP | 2007-251176 A | 9/2007 |
| JP | 2007-281468 A | 10/2007 |
| JP | 2007-294966 A | 11/2007 |
| KR | 10-2007-0082614 A | 8/2007 |
| KR | 10-2007-0094384 A | 9/2007 |
| KR | 10-0764432 B1 | 10/2007 |
| WO | WO-2006/098545 A3 | 9/2006 |

OTHER PUBLICATIONS

Chinese Office Action, with English translation, issued in Chinese Patent Application No. 200810133515.3, mailed Sep. 27, 2010.
Taiwanese Office Action, and English translation thereof, issued in Taiwanese Patent Application No. 97121870 dated Apr. 11, 2012.
Japanese Office Action, w/ English translation, issued in Japanese Patent Application No. JP 2008-173923, dated May 10, 2011.
Office Action from Chinese Patent Application No. 201110092721.6 dated Oct. 31, 2012.

* cited by examiner

LIGHT EMITTING DEVICE PACKAGE AND METHOD OF MANUFACTURING THE SAME

CROSS-REFERENCE TO RELATED APPLICATIONS

This application is a Divisional of U.S. application Ser. No. 12/213,241, filed Jun. 17, 2008, which claims the benefit of Korean Patent Application No. 10-2008-0039277 filed with the Korea Intellectual Property Office on Apr. 28, 2008, the disclosure of which is incorporated herein by reference.

BACKGROUND OF THE INVENTION

1. Field of the Invention

The present invention relates to a light emitting device package and a method of manufacturing the same; and, more particularly, to a light emitting device package for applying power to a light emitting device through a metal core by forming a cavity to expose a top surface of the metal core through removal of parts of an insulating layer and a metal layer sequentially formed on the metal core and by directly mounting the light emitting device on the top surface of the metal core in the cavity, and a method of manufacturing the same.

2. Description of the Related Art

Generally, a light emitting device has been widely used as a light source since it has several advantages such as low power consumption and high luminance.

In particular, the light emitting device has recently been adopted as an illumination apparatus and a back light apparatus for an LCD (Liquid Crystal Display) and supplied in a package type easy to be mounted on various apparatuses such as the illumination apparatus or the like, wherein a light emitting device package has been evaluated in terms of a heat discharging performance for discharging heat generated from the light emitting device as an important evaluation standard as well as protection of the light emitting device and a connection structure to the apparatuses.

High heat discharging performance is a more important package condition in the field needing a high output light emitting device such as a general illumination apparatus and the back light apparatus for the LCD.

That is, the performance and the lifetime of the light emitting device in the light emitting device package may be exponentially reduced as an operation temperature of the light emitting device rises and when the operation temperature of the light emitting device rises at more than predetermined temperature, the light emitting device may be discolored, and therefore it is required to sufficiently discharge the heat generated from the light emitting device so as to maintain the optimum operation temperature thereof.

Accordingly, several studies with regard to the light emitting device capable of improving the performance and the lifetime by simplifying the structure and enhancing the heat discharging performance have been recently progressed.

SUMMARY OF THE INVENTION

The present invention has been invented in order to overcome the above-described problem and it is, therefore, an object of the present invention to provide a light emitting device package and a method of manufacturing the same capable of being applicable to a high heat generating device by improving a heat discharging performance and reducing a cost by simplifying an entire structure and a manufacturing process of the light emitting device package as power is applied to a light emitting device through a metal core by forming a cavity to expose a top surface of the metal core through removal of parts of an insulating layer and a metal layer sequentially formed on the metal core and by directly mounting the light emitting device on the top surface of the metal core in the cavity.

In accordance with a first embodiment of the present invention to achieve the object, there is provided a light emitting device package including a metal core; an insulating layer formed on the metal core; a metal layer formed on the insulating layer; a first cavity formed by removing parts of the metal layer and the insulating layer to expose a top surface of the metal core; and a light emitting device directly mounted on the top surface of the metal core in the first cavity.

Further, the metal core may be made of aluminum.

Further, the insulating layer may be formed by anodizing treatment.

Further, the light emitting device package may further include a bonding wire electrically connecting the light emitting device and the metal layer placed on a position adjacent to the first cavity.

Further, the light emitting device package may further include a second cavity formed by removing parts of the metal layer and the insulating layer to expose the top surface of the metal core on a position apart from the first cavity at a predetermined distance.

Further, the light emitting device package may further include a conductive layer formed on the top surface of the metal core in the second cavity.

Further, the conductive layer may be made of any one selected from a group consisting of Au, Ag, Ni and Cu.

Further, the conductive layer may be composed of a metal plating layer or a metal paste.

Further, the light emitting device package may further include a second insulating layer and a second metal layer sequentially formed on a bottom surface of the metal core and having a third cavity to expose the bottom surface of the metal core on a position corresponding to the first cavity.

Further, the light emitting device package may further include grooves formed by removing parts of the metal layer and the insulating layer on positions adjacent to the first cavity to expose the top surface of the metal core; and a cap coupled on an upper part of the first cavity as protrusions formed on a circumferential portion of the cap are inserted into the grooves.

Further, the cap may be a protection cap or a lens.

And, in accordance with a second embodiment of the present invention to achieve the object, there is provided a light emitting device package including a metal core; an insulating layer formed on the metal core; a metal layer formed on the insulating layer and having a first electrode and a second electrode electrically separated from each other; a first cavity formed by removing parts of the metal layer and the insulating layer to expose a top surface of the metal core; a light emitting device directly mounted on the top surface of the metal core in the cavity; a first bonding wire electrically connecting the light emitting device and the first electrode; and a second bonding wire electrically connecting the light emitting device and the second electrode.

And, in accordance with a modified embodiment of the second embodiment of the present invention to achieve the object, there is provided a light emitting device package including a metal core; an insulating layer formed on the metal core; a metal layer formed on the insulating layer and having a first electrode and a second electrode electrically separated from each other; a first cavity formed by removing parts of the metal layer and the insulating layer to expose a top surface of the metal core; a light emitting device directly mounted on the top surface of the metal core in the first cavity; a first boding wire electrically connecting the light emitting device and the first electrode; and a second bonding wire electrically connecting the light emitting device and the metal core exposed by the first cavity.

And, in accordance with a third embodiment of the present invention to achieve the object, there is provided a light emitting device package including a metal core; an insulating layer formed on the metal core; a metal layer formed on the insulating layer and having a first electrode and a second electrode electrically separated from each other; a first cavity formed by removing parts of the metal layer and the insulating layer to expose a top surface of the metal core; and a light emitting device directly mounted on the top surface of the metal core in the first cavity and having connection units electrically connected to the metal core and the first electrode respectively on a bottom surface.

And, in accordance with a fourth embodiment of the present invention to achieve the object, there is provided a light emitting device package including a metal core having a first cavity composed of a lower cavity and an upper cavity; an insulating layer formed on a top surface of the metal core excluding the lower cavity and including an inner surface of the upper cavity; a metal layer formed on the insulating layer and having a first electrode and a second electrode electrically separated from each other; a light emitting device directly mounted on the metal core in the lower cavity; and a bonding wire electrically connecting the light emitting device and the first electrode.

And, in accordance with a modified embodiment of the fourth embodiment of the present invention to achieve the object, there is provided a light emitting device package including a metal core having a first cavity composed of a lower cavity and an upper cavity; an insulating layer formed on a top surface of the metal core excluding the lower cavity and including the upper cavity; a metal layer formed on the insulating layer and having a first electrode and a second electrode electrically separated from each other; a light emitting device directly mounted on the metal core in the lower cavity; a first bonding wire electrically connecting the light emitting device and the first electrode; and a second bonding wire electrically connecting the light emitting device and a portion of the metal core where the insulating layer is not formed.

And, a method of manufacturing the light emitting device package in accordance with the first embodiment of the present invention to achieve the object, may include the steps of: forming an insulating layer on a metal core; forming a metal layer on the insulating layer; forming a first cavity to expose a top surface of the metal core by removing parts of the metal layer and the insulating layer; and directly mounting a light emitting device on the top surface of the metal core in the first cavity.

Further, the metal core may be made of aluminum.

Further, the insulating layer may be formed by anodizing treatment.

Further, after mounting the light emitting device, the method may further include the step of: electrically connecting the light emitting device and the metal layer placed on a position adjacent to the first cavity through a bonding wire.

Further, after forming the first cavity, the method may further include the step of: forming a second cavity to expose the top surface of the metal core on a position apart from the first cavity at a predetermined distance by removing parts of the metal layer and the insulating layer.

Further, after forming the second cavity, the method may further include the step of: forming a conductive layer on the top surface of the metal core in the second cavity.

Further, the conductive layer may be made of any one selected from a group consisting of Au, Ag, Ni and Cu.

Further, the conductive layer may be composed of a metal plating layer or a metal paste.

Further, the method may further include the step of: sequentially forming a second insulating layer and a second metal layer on a bottom surface of the metal core, and then forming a third cavity to expose the bottom surface of the metal core on a position corresponding to the first cavity by removing parts of the second metal layer and the second insulating layer.

And, a method of manufacturing the light emitting device package in accordance with the second embodiment of the present invention to achieve the object, may include the steps of: forming an insulating layer on a metal core; forming a metal layer on the insulating layer; forming a first electrode and a second electrode electrically separated from each other on the insulating layer adjacent to a first cavity by forming the first cavity to expose a top surface of the metal core through removal of parts of the metal layer and the insulating layer; directly mounting a light emitting device on the top surface of the metal core in the first cavity; and electrically connecting the light emitting device and the first electrode through a first bonding wire and electrically connecting the light emitting device and the second electrode through a second bonding wire.

Further, the light emitting device may be electrically connected to the metal core exposed by the first cavity through the second bonding wire.

And, a method of manufacturing the light emitting device package in accordance with the third embodiment of the present invention to achieve the object, may include the steps of: forming an insulating layer on a metal core; forming a metal layer on the insulating layer; forming a first electrode and a second electrode electrically separated from each other on the insulating layer adjacent to a first cavity by forming the first cavity to expose a top surface of the metal core through removal of parts of the metal layer and the insulating layer; and directly mounting a light emitting device having connection units electrically connected to the metal core and the first electrode respectively on a bottom surface, on the top surface of the metal core in the first cavity.

Further, the connection units may be any one selected from a group consisting of a bump, a pad and a solder ball.

And, a method of manufacturing the light emitting device package in accordance with the four embodiment of the present invention to achieve the object, may include the steps of: supplying a metal core having a first cavity composed of a lower cavity and an upper cavity; forming an insulating layer on a top surface of the metal core excluding the lower cavity and including an inner surface of the upper cavity; forming a metal layer having a first electrode and a second electrode electrically separated from each other on the insulating layer; directly mounting a light emitting device on the metal core in the lower cavity; and electrically connecting the light emitting device and the first electrode through a bonding wire.

Further, before or after electrically connecting through the bonding wire, the method may further include the step of: electrically connecting the light emitting device and a portion of the metal core where the insulating layer is not formed through a second bonding wire.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 16 and FIG. 17 are plane-views showing the structure of the light emitting device package in accordance with the fourth embodiment of the present invention, wherein FIG. 16 is a view showing a first electrode formed on a partial inner surface of an upper cavity and FIG. 17 is a view showing a first electrode formed on an entire inner surface of the upper cavity.

DETAILED DESCRIPTION OF THE PREFERRED EMBODIMENTS

Hereinafter, in accordance with the present invention, a subject regarding to a technical configuration for the object of a light emitting device package and a method of manufacturing the same and an operation effect thereof will be appreciated clearly through the following detailed description with reference to the accompanying drawings illustrating preferable embodiments of the present invention.

First Embodiment

A Structure of a Light Emitting Device Package in Accordance with a First Embodiment A light emitting device package in accordance with a first embodiment of the present invention will be described in detail with reference to FIG. 1 and FIG. 2.

Figure 1:
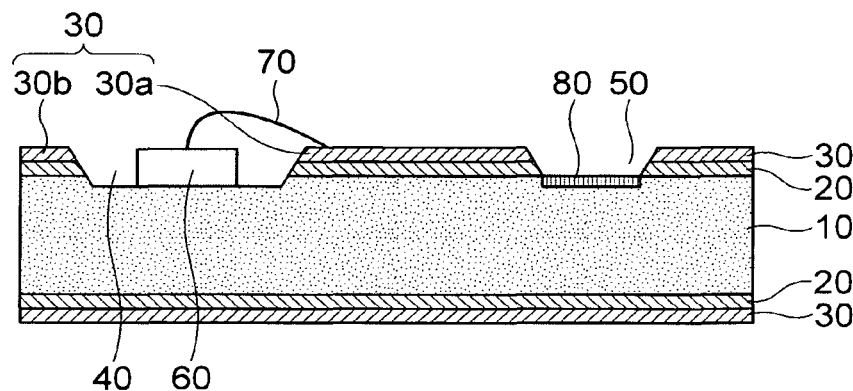
FIG. 1 is a cross-sectional view showing a structure of a light emitting device package in accordance with a first embodiment of the present invention.
Figure 2:
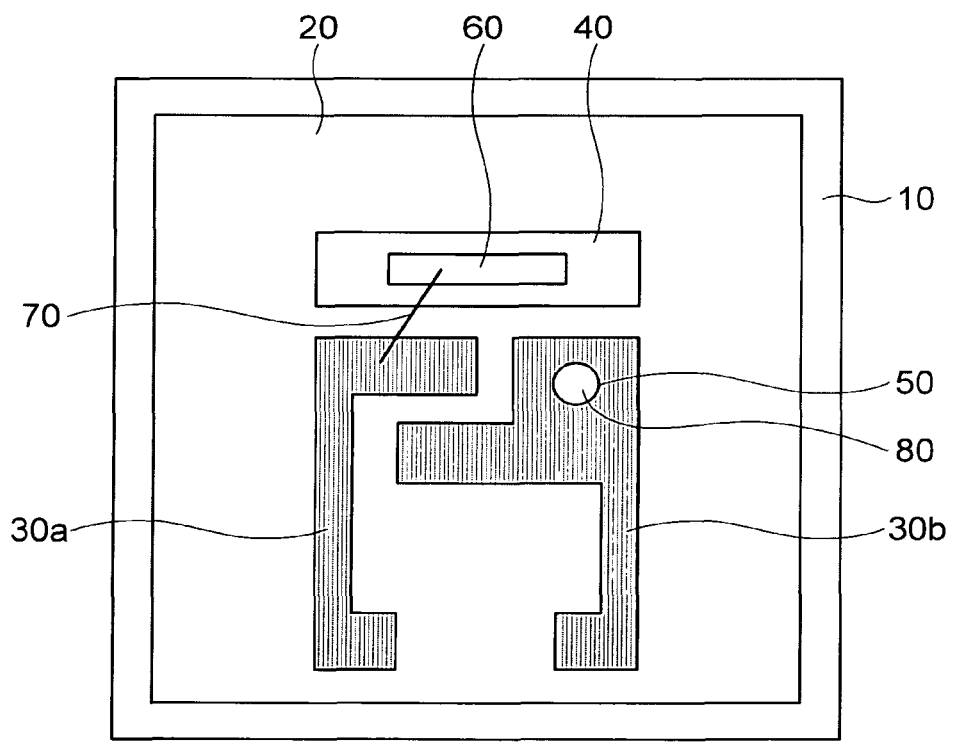
FIG. 2 is a plane-view showing the structure of the light emitting device package in accordance with the first embodiment of the present invention.

FIG. 1 is a cross-sectional view showing a structure of the light emitting device package in accordance with the first embodiment of the present invention and FIG. 2 is a plane-view showing the structure of the light emitting device package in accordance with the first embodiment of the present invention.

As shown in FIG. 1 and FIG. 2, in accordance with the first embodiment of the present invention, the light emitting device package includes a metal core 10, an insulating layer 20 formed on the metal core 10 and a metal layer 30 formed on the insulating layer 20.

The insulating layer 20 and the metal layer 30 may be formed only on a top surface of the metal core 10, however, as shown in the drawing, be formed on both the top surface and a bottom surface of the metal core 10.

A first cavity 40 is formed to expose the top surface of the metal core 10 by removing parts of the metal layer 30 and the insulating layer 20. The first cavity 40 supplies a space for mounting a light emitting device 60 and may be formed through a processing method such as mechanical processing or etching or the like.

Herein, the metal layer 30 may have a first electrode 30a and a second electrode 30b electrically separated from each other on positions adjacent to the first cavity 40.

The light emitting device 60 is directly mounted on the top surface of the metal core 10 exposed by the first cavity 40.

The metal core 10 may be made of material with a high thermal conductivity, for example, a metal such as aluminum (Al) or the like.

The insulating layer 20 as an oxide film layer ($Al_2O_3$) may be formed through anodizing treatment on the metal core 10 made of the Al or a conventional insulating layer such as a polymer based insulating layer or the like may be formed on a surface of the metal core 10, however, it is preferable to form the oxide film layer ($Al_2O_3$) capable of realizing low thermal resistance by having a relatively high thermal conductivity and a thin thickness.

The Al is easily obtainable metal material at a comparatively low cost and further has a very high thermal conductivity. Further, the oxide film layer ($Al_2O_3$) obtained through the anodizing treatment also has the relatively high thermal conductivity of approximately 10~30 W/mK.

Therefore, the metal core 10 can have a high heat discharging performance in comparison with a PCB (Printed Circuit Board) or an MCPCB (Metal Core Printed Circuit Board) made of conventional polymer material. Moreover, a process for anodizing the Al is a comparatively easy process and reduces process cost and time.

The light emitting device 60 as a light source device for generating light such as a light emitting diode is directly mounted on the top surface of the metal core 10 to be connected.

And, the light emitting device 60 and the metal layer 30 placed on a position adjacent to the first cavity 40, for example, a first electrode 30a may be electrically connected through a bonding wire 70.

Through the above described construction, the light emitting device 60 electrically connected to the metal core 10 and the first electrode 30a on the insulating layer 20 is operated to discharge light outside by being applied with power through the metal core 10 and the first electrode 30a.

That is, in the light emitting device package in accordance with the present embodiment, the light emitting device 60 has a vertical electrode structure, one electrode (not shown) of the light emitting device 60 is directly connected to the metal core 10 and the other electrode (not shown) thereof is connected to the adjacent metal layer 30 through the bonding wire 70.

Therefore, it is preferable that when the metal core has electrically (+) polarity, a portion of the metal layer 30 wire-bonded to the light emitting device 60 has electrically (−) polarity.

As described above, the light emitting device package in accordance with the present embodiment directly mounts the light emitting device 60 on the metal core 10 made of Al with the high thermal conductivity, thereby effectively discharging heat generated from the light emitting device 60 to the outside through the metal core 10.

Further, the metal core 10 is used not only as a substrate mounting the light emitting device 60 but also as one electric passage applying power to the light emitting device 60, thereby reducing a manufacturing cost by simplifying components and manufacturing processes of the light emitting device package.

At this time, on a position apart from the first cavity mounting the light emitting device 60 at a predetermined distance, a second cavity 50 is formed by removing parts of the metal layer 30 and the insulating layer 20 to expose the top surface of the metal core 10.

The second cavity 50 is an opened part to play a role of a package by electrically connecting the metal core 10 to the outside, thereby electrically connecting the device to the outside through a connector or other connection method.

A conductive layer 80 for electrical connection to the outside may be formed on the top surface of the metal core 10 in the second cavity 50. The conductive layer may be made of Au, Ag, Ni or Cu, and so on.

The conductive layer 80 may be a metal plating layer formed in a plating method or high-temperature cured metal paste.

As described above, because the light emitting device package in accordance with the first embodiment directly mounts the light emitting device 60 on top surface of the metal core 10, a heat discharging performance thereof is improved to be applicable to a high heat generating device and further an entire structure and a manufacturing process thereof are simplified to reduce a cost.

Figure 3:
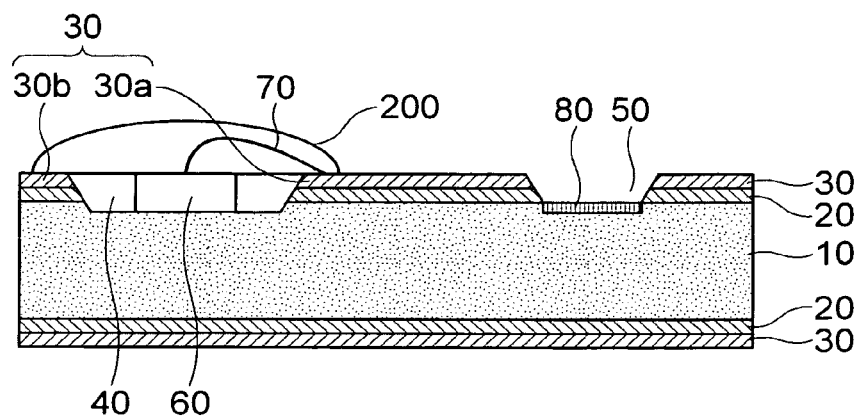
FIG. 3 is a cross-sectional view showing a structure of the light emitting device package with a cap in accordance with the first embodiment of the present invention.
Figure 4A:
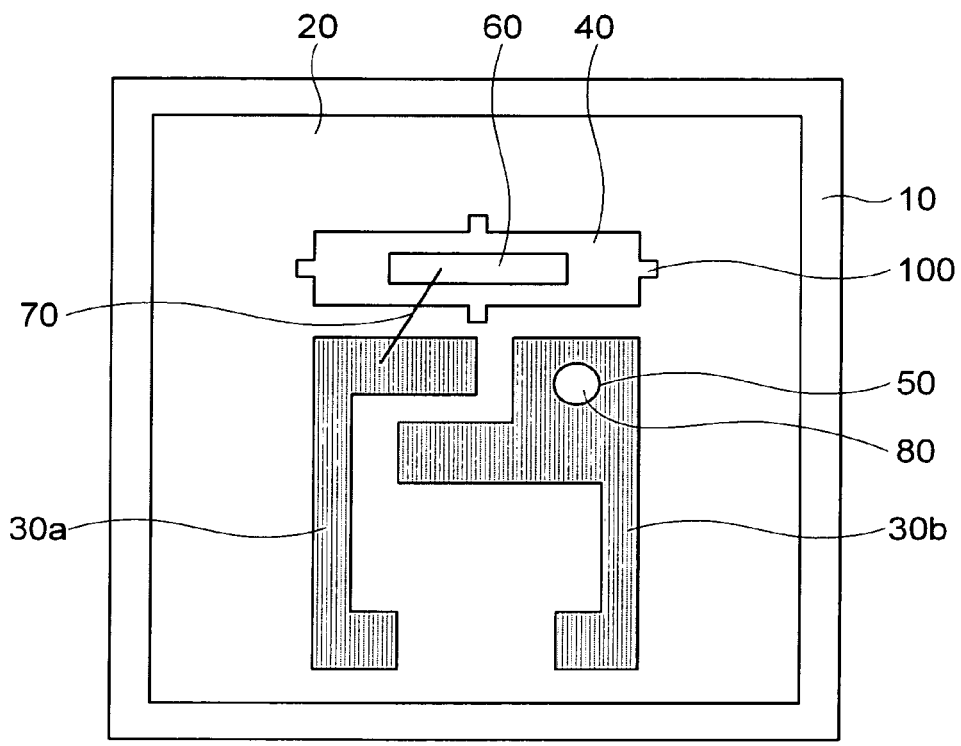
FIG. 4a is a plan-view showing the structure of the light emitting device package including grooves for fixing the cap in FIG. 3.
Figure 4B:
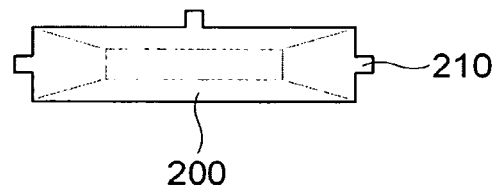
FIG. 4b is a view showing an example of the cap.

Herein, FIG. 3 is a cross-sectional view showing a structure of the light emitting device package including a cap in accordance with the first embodiment of the present invention, FIG. 4a is a plan-view showing the structure of the light emitting device package including grooves for fixing the cap in FIG. 3, and FIG. 4b is a view showing an example of the cap.

In the light emitting device package in accordance with the first embodiment of the present invention, as shown in FIG. 3, a cap 200 may be formed on an upper part of the first cavity 40 mounting the light emitting device 60.

The cap 200 may be a protection cap for protecting the light emitting device 60 or a lens.

At this time, as shown in FIG. 4a, on positions adjacent to the first cavity 40 mounting the light emitting device 60, grooves 100 are further formed by removing parts of the metal layer 30 and the insulating layer 20 to expose the top surface of the metal core 10.

The grooves 100 are to easily array and fix a position of the cap 200 and the present invention is not limited to the number and the positions of the grooves 100.

And, as shown in FIG. 4b, protrusions 210 formed on a circumferential portion of the cap 200 are inserted into the grooves 100 and the cap 200 can be coupled to the upper part of the first cavity 40.

As described above, when forming the cap 200 on the upper part of the light emitting device 60, it is possible to easily array a position of the cap 200 and also stably fix not to move the cap 200 by forming the grooves 100 to expose the metal core 10 and inserting the protrusions 210 formed on the circumferential portion of the cap 200 into the grooves 100.

Modified Embodiment

A modified embodiment of the first embodiment will be described with reference to FIG. 5. Only, description for the same construction of the modified embodiment as that of the first embodiment will be omitted and only different construction thereof from that of the first embodiment will be described in detail.

Figure 5:
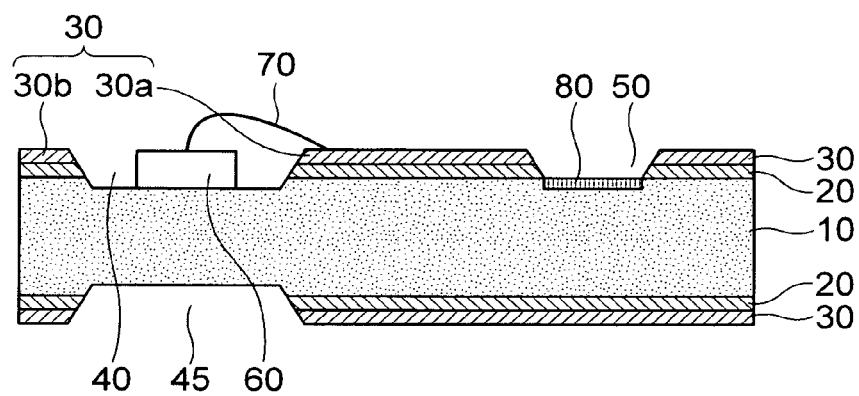
FIG. 5 is a cross-sectional view showing a modified embodiment of the light emitting device package in accordance with the first embodiment.

FIG. 5 is a cross-sectional view showing a modified embodiment of the light emitting device package in accordance with the first embodiment.

In accordance with the modified embodiment of the first embodiment, most of construction of the light emitting device package is the same as that of the above-described light emitting device package in accordance with the first embodiment, only as shown in FIG. 5, there is difference from the light emitting device package in accordance with the first embodiment in that a third cavity 45 to expose a bottom surface of the metal core 10 is formed by removing parts of the insulating layer and the metal layer sequentially formed on the bottom surface of the metal core 10.

The third cavity 45 is preferably formed on a position corresponding to the first cavity to expose the top surface of the metal core 10.

In accordance with the modified embodiment of the first embodiment, the light emitting device package is capable of preventing warpage or deformation of the metal core 10 through the third cavity 45 formed on the position vertically corresponding to the first cavity 40 as well as obtaining the same operation and effect as those of the light emitting device package in accordance with the first embodiment.

Method of Manufacturing the Light Emitting Device Package in Accordance with the First Embodiment Hereinafter, a method of manufacturing the light emitting device package in accordance with the first embodiment of the present invention will be described in detail with reference to FIG. 6 to FIG. 11.

Figure 6:
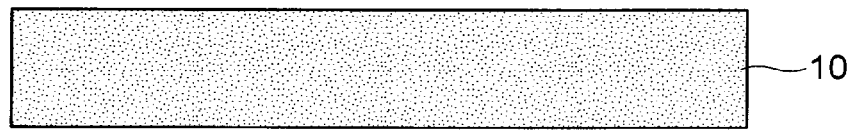
FIG. 6 to FIG. 11 are cross-sectional views sequentially showing a method of manufacturing the light emitting device package in accordance with the first embodiment.

FIG. 6 to FIG. 11 are cross-sectional views sequentially showing the method of manufacturing the light emitting device package in accordance with the first embodiment;

First of all, as shown in FIG. 6, a metal core 10 is supplied. The metal core may be made of aluminum or the like.

Figure 7:
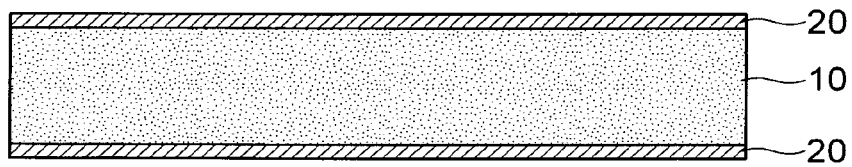

Then, as shown in FIG. 7, insulating layers 20 are formed on the metal core 10. The insulating layers 20 may be formed through anodizing treatment on both a top surface and a bottom surface of the metal core 10 as shown in the drawing or only on the top surface of the metal core 10.

Figure 8:
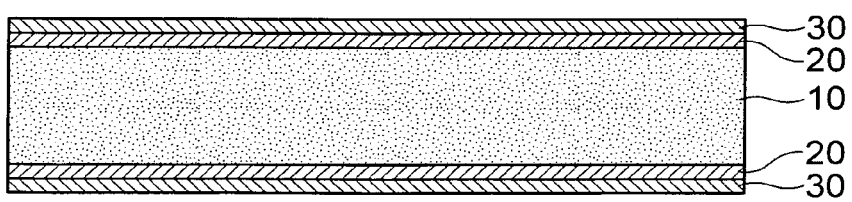

Then, as shown in FIG. 8, metal layers 30 are formed on the insulating layers 20. The metal layers 30 like the insulating layers 20 may be formed on both an upper part and a lower part of the metal core 10 or only on the upper part of the metal core.

Figure 9:
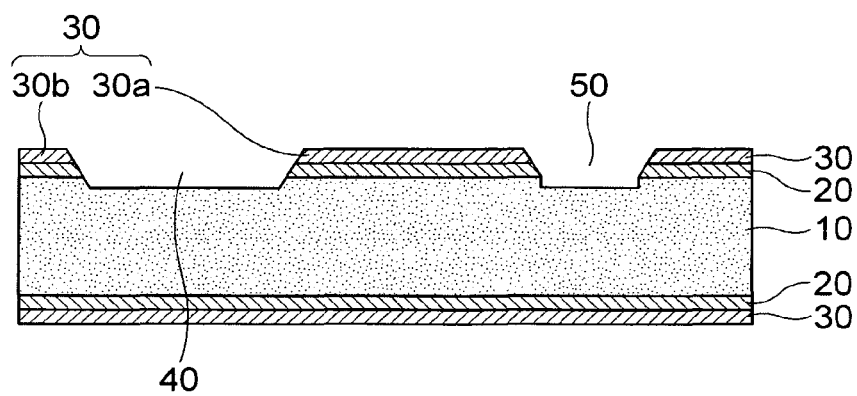

Then, as shown in FIG. 9, a first cavity 40 to expose the top surface of the metal core 10 is formed by removing parts of the metal layer 30 and the insulating layer 20. Herein, after forming the first cavity 40, a second cavity 50 to expose the top surface of the metal core is formed on a position apart from the first cavity 40 at a predetermined distance by removing parts of the metal layer 30 and the insulating layer 20. The second cavity 50 may be simultaneously formed when the first cavity 40 is formed.

Figure 10:
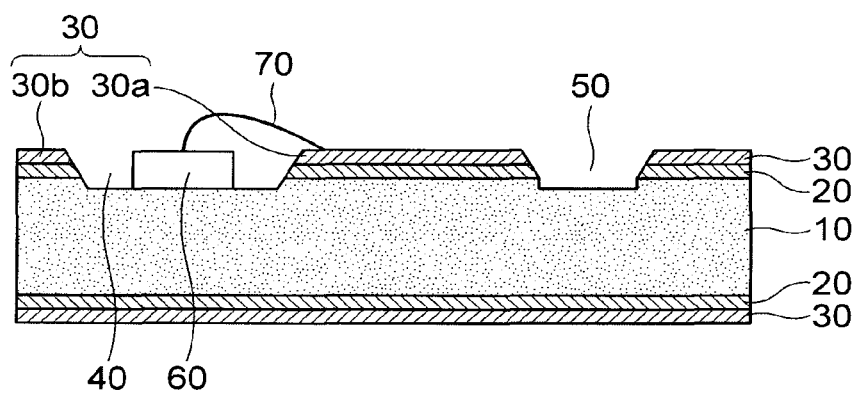

Then, as shown in FIG. 10, a light emitting device 60 with a vertical electrode structure is directly mounted on the top surface of the metal core 10 in the first cavity 40, and then the light emitting device 60 and the metal layer 30 placed on a position adjacent to the first cavity 40 are electrically connected through a bonding wire 70.

Figure 11:
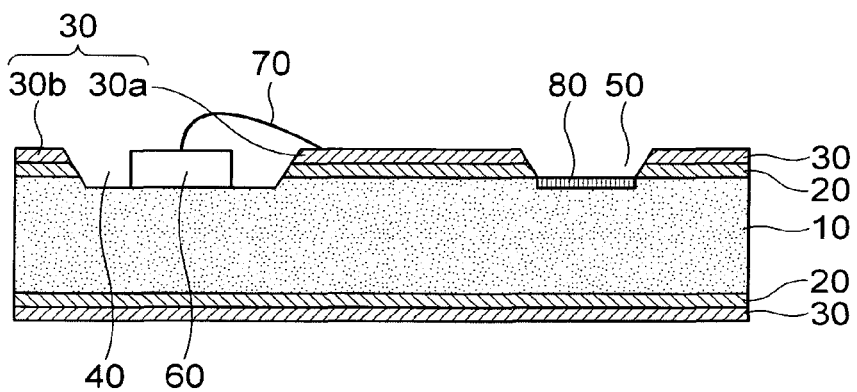

Then, as shown in FIG. 11, a conductive layer 80 is formed on the top surface of the metal core 10 in the second cavity 50. The conductive layer 80 may be made of Au, Ag, Ni or Cu or the like. Further, the conductive layer 80 may be a metal plating layer formed in a plating method or high-temperature cured metal paste.

Meanwhile, as described above, when forming the insulating layer 20 and the metal layer 30 on the bottom surface of the metal core 10 as well as the top surface thereof, although not shown in the drawings, a third cavity (referring to a reference numeral '45' in FIG. 5) may be formed by removing parts of the metal layer 30 and the insulating layer 20 formed on the bottom surface of the metal core 10 to expose the bottom surface of the metal core 10 on a position corresponding to the first cavity 40. In this case, it is possible to prevent warpage or deformation of the metal core 10 through the third cavity 45.

Then, a cap 200 may be formed on an upper part of the first cavity 40 mounting the light emitting device 60. When forming the cap 200, grooves 100 may be further formed on a position adjacent to the first cavity 40 by removing parts of the metal layer 30 and the insulating layer 20 to expose the top surface of the metal core 10.

Then, the cap with protrusions 210 formed on a circumferential portion is coupled to the upper part of the first cavity 40. At this time, it is preferable to insert the protrusions formed on the cap 200 into the grooves 100.

Second Embodiment

A Structure of a Light Emitting Device Package in Accordance with a Second Embodiment Hereinafter, a light emitting device package in accordance with a second embodiment of the present invention will be described in detail with reference to FIG. 12. Only, description for the same construction of the second embodiment as that of the first embodiment will be omitted and only different construction thereof from that of the first embodiment will be described in detail.

Figure 12:
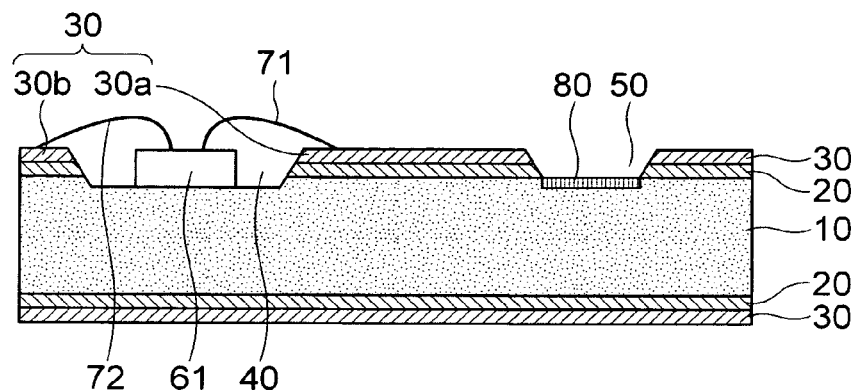
FIG. 12 is a cross-sectional view showing a structure of a light emitting device package in accordance with a second embodiment of the present invention.

FIG. 12 is a cross-sectional view showing a structure of the light emitting device package in accordance with the second embodiment of the present invention.

As shown in FIG. 12, in accordance with the second embodiment, most of construction of the light emitting device package is the same as that of the emitting device package in accordance with the first embodiment, only there is difference from the light emitting device package in accordance with the first embodiment in that a light emitting device 61 has a parallel electrode structure not the vertical structure package, one electrode (not shown) of the light emitting device 61 is electrically connected to a first electrode 30*a* of a metal layer 30 through a first boding wire 71 and the other electrode (not shown) thereof is electrically connected to a second electrode 30*b* electrically separated from the first electrode 30*a* through a second bonding wire 72.

That is, in accordance with the second embodiment of the present invention, the light emitting device package includes a metal core 10, an insulating layer 20 formed on the metal core 10, the metal layer 30 formed on the insulating layer 20 and having the first electrode 30*a* and a second electrode 30*b* electrically separated from each other, a first cavity 40 formed by removing parts of the metal layer 30 and the insulating layer 20 to expose the top surface of the metal core 10 and the light emitting device 61 with the parallel electrode structure directly mounted on the top surface of the metal core 10 in the first cavity 40.

The metal core 10 may be aluminum or the like and the insulating layer 20 may be composed of an oxide film layer ($Al_2O_3$) or the like formed through anodizing treatment.

As described above, the light emitting device 61 is connected to the first electrode 30*a* through the first bonding wire 71 and to the second electrode 30*b* through the second bonding wire 72.

It is preferable that the first electrode 30*a* and the second electrode 30*b* electrically connected to the light emitting device 61 are placed on a position adjacent to the first cavity 40 mounting the light emitting device 61 to facilitate a wire bonding process.

The light emitting device 61 is operated to discharge light to the outside by being applied with power through the first and second electrodes 30*a* and 30*b* of the metal layer 30. Therefore, it is preferable that when the first electrode 30*a* has electrically (−) polarity, the second electrode 30*b* has electrically (+) polarity.

On a position apart from the first cavity 40 at a predetermined distance, a second cavity 50 is formed by removing parts of the metal layer 30 and the insulating layer 20 to expose the top surface of the metal core 10.

A conductive layer 80 for electrical connection to the outside may be formed on the top surface of the metal core 10 in the second cavity and made of Au, Ag, Ni or Cu or the like. The conductive layer 80 may be a metal plating layer formed in a plating method or high-temperature cured metal paste.

And, although not shown in the drawing, in accordance with the second embodiment of the present invention like the modified embodiment of the first embodiment, the light emitting device package may further include an insulating layer 20 and a metal layer 30 sequentially formed on a bottom surface of the metal core 10 and having a third cavity (referring to a reference numeral '45' in FIG. 5) to expose the bottom surface of the metal core 10 on a position corresponding to the first cavity 40.

Further, in accordance with the second embodiment of the present invention like the above mentioned first embodiment of the present invention, the light emitting device package may further include grooves 100 to expose the top surface of the metal core 10 on positions adjacent to the first cavity 40 by removing parts of the metal layer 30 and the insulating layer 20. And, protrusions 210 formed on a circumferential portion of the cap 200 are inserted into the grooves 100 and the cap 200 can be coupled to an upper part of the first cavity 40.

In accordance with the second embodiment of the present invention, the light emitting device package is capable of improving a heat discharging performance and simplifying an entire structure and a manufacturing process by directly mounting the light emitting device 61 on the top surface of the metal core 10 with a high thermal conductivity.

Modified Embodiment

A modified embodiment of the second embodiment will be described with reference to FIG. 13. Only, description for the same construction of the modified embodiment as that of the second embodiment will be omitted and only different construction thereof from that of the second embodiment will be described in detail.

Figure 13:
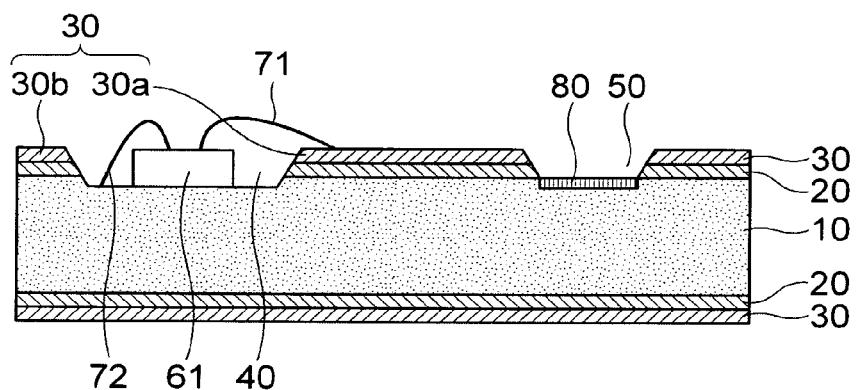
FIG. 13 is a cross-sectional view showing a modified embodiment of the light emitting device package in accordance with the second embodiment of the present invention.

FIG. 13 is a cross-sectional view showing a modified embodiment of the light emitting device package in accordance with the second embodiment of the present invention.

As shown in FIG. 13, in accordance with of the modified embodiment of the second embodiment of the present invention, most of construction of the light emitting device package is the same as that of the above-mentioned light emitting device package in accordance with the second embodiment, only there is difference from the light emitting device package in accordance with the second embodiment in that one electrode (not shown) of a light emitting device 61 with a parallel electrode structure is electrically connected to a first electrode 30a through a first bonding wire 71 and the other electrode (not shown) thereof is electrically connected to a metal core 10 exposed by a first cavity 40 through a second bonding wire 72.

At this time, it is preferable that when the metal core 10 has electrically (+) polarity, the first electrode 30a has electrically (−) polarity.

And, although not shown in the drawing, in accordance with the modified embodiment of the second embodiment like the above-mentioned modified embodiment of the first embodiment, the light emitting device package may further include an insulating layer 20 and a metal layer 30 sequentially formed on a bottom surface of the metal core 10 and having a third cavity (referring to a reference numeral '45' in FIG. 5) to expose the bottom surface of the metal core 10 on a position corresponding to the first cavity 40.

Further, as described above, in accordance with the modified embodiment of the second embodiment of the present invention, the light emitting device package may further include grooves 100 formed on positions adjacent to the first cavity 40 to expose the top surface of the metal core 10, and a cap 200 coupled to an upper part of the first cavity 40 by inserting protrusions 210 formed on a circumferential portion of the cap 200 into the grooves 100.

In accordance with the modified embodiment of the second embodiment of the present invention, the light emitting device package is capable of improving a heat discharging performance by discharging heat generated from the light emitting device 61 directly mounted on the metal core 10 to the outside through the metal core.

Further, the metal core is used as one electric passage applying power to the light emitting device 61 and therefore components and manufacturing processes of the light emitting device package are simplified to reduce a cost.

Method of Manufacturing the Light Emitting Device Package in Accordance with the Second Embodiment Hereinafter, a method of manufacturing the light emitting device package in accordance with the second embodiment of the present invention will be described in detail with reference to FIG. 6 to FIG. 9, FIG. 12 and FIG. 13. Only, description for the same construction of the second embodiment as that of the first embodiment will be omitted and only different construction thereof from that of the first embodiment will be described in detail.

First of all, as shown in FIG. 6, a metal core 10 is supplied, and then, as shown in FIG. 7, insulating layers 20 are formed on the metal core 10.

Then, as shown in FIG. 8, metal layers 30 are formed on the insulating layers 20.

Then, as shown in FIG. 9, a first cavity 40 is formed by removing parts of the metal layer 30 and the insulating layer 20 to expose the top surface of the metal core 10. At this time, a first electrode 30a and a second electrode 30b electrically separated from each other may be formed on the insulating layer 20 adjacent to the first cavity 40.

Herein, after forming the first cavity 40, a second cavity 50 is formed by removing parts of the metal layer 30 and the insulating layer 20 to expose the top surface of the metal core 10 on a position apart from the first cavity 40 at a predetermined distance. The second cavity 50 may be simultaneously formed when the first cavity 40 is formed.

Then, as shown in FIG. 12, a light emitting device 61 with a parallel electrode structure is directly mounted on the top surface of the metal core 10 in the first cavity 40, and then the light emitting device 61 and the first electrode 30a are electrically connected through a first boding wire 71 and the light emitting device 61 and the second electrode 30b are electrically connected through a second bonding wire 72.

Then, a conductive layer 80 is formed on the top surface of the metal core 10 in the second cavity 50.

Meanwhile, the light emitting device 61 may be electrically connected to the metal core 10 exposed by the first cavity as shown in FIG. 13 instead of the second electrode 30b as shown in FIG. 12 through the second bonding wire 72.

Further, as described above, when the insulating layer 20 and the metal layer 30 are formed on a bottom surface of the metal core 10, although not shown in the drawing, a third cavity (referring to a reference numeral '45' in FIG. 5) may be formed by removing a part of the metal layer 30 and the insulating layer 20 formed on the bottom surface of the metal core 10 to expose the bottom surface of the metal core 10 on a position corresponding to the first cavity 40.

Third Embodiment

A Structure of a Light Emitting Device Package in Accordance with a Third Embodiment Hereinafter, a light emitting device package in accordance with a third embodiment of the present invention will be described in detail with reference to FIG. 14. Only, description for the same construction of the third embodiment as that of the first embodiment will be omitted and only different construction thereof from that of the first embodiment will be described in detail.

Figure 14:
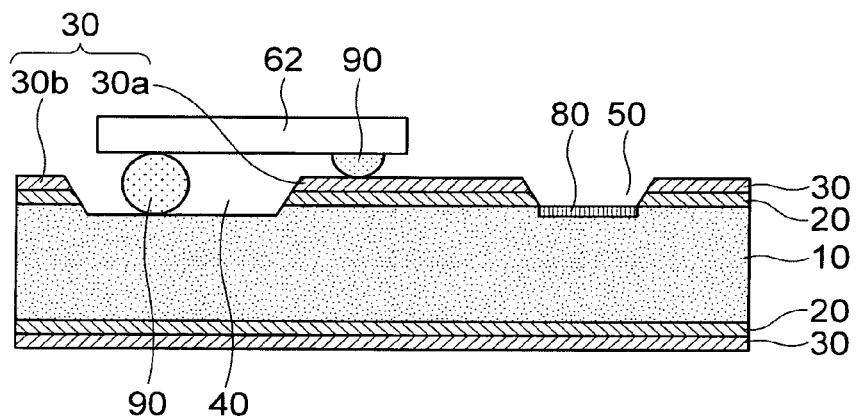
FIG. 14 is a cross-sectional view showing a structure of a light emitting device package in accordance with a third embodiment of the present invention.

FIG. 14 is a cross-sectional view showing a structure of the light emitting device package in accordance with the third embodiment of the present invention.

As shown in FIG. 14, in accordance with the third embodiment of the present invention, most of construction of the light emitting device package is the same as that of the above-mentioned light emitting device package in accordance with the first embodiment, only there is difference from the light emitting device package in accordance with the first embodiment in that a light emitting device 62 has a flip chip structure not the vertical electrode structure and includes connection units 90 on a bottom surface and the connection units 90 are electrically connected to a metal core 10 exposed by the first cavity 40 and a first electrode 30a respectively.

It is preferable that the first electrode 30a electrically connected to any one of the connection units 90 of the light emitting device 62 is placed on a position adjacent to the first cavity mounting the light emitting device 62 so as to facilitate a flip chip bonding process.

At this time, it is preferable that when the metal core 10 electrically connected to the connection unit 90 of the light emitting device 62 has electrically (+) polarity, the first electrode 30a has electrically (−) polarity.

Herein, the connection units 90 may be composed of a solder ball as shown in the drawing or a bump (not shown) and a pad (not shown).

Further, in accordance with a modified embodiment of the third embodiment like the modified embodiment of the first embodiment, although not shown in the drawing, the light emitting device package may further include an insulating layer 20 and a metal layer 30 sequentially formed on a bottom surface of the metal core 10 and having a third cavity (referring to a reference numeral '45' in FIG. 5) to expose the bottom surface of the metal core 10 on a position corresponding to the first cavity 40.

The light emitting device package in accordance with the third embodiment is capable of obtaining the same operation and effect as those of the first embodiment by directly mounting the light emitting device 62 on the metal core 10 through flip chip bonding instead of wire bonding.

Method of Manufacturing the Light Emitting Device Package in Accordance with the Third Embodiment Hereinafter, a method of manufacturing the light emitting device package in accordance with the third embodiment of the present invention will be described in detail with reference to FIG. 6 to FIG. 9 and FIG. 14. Only, description for the same construction of the third embodiment as that of the first embodiment will be omitted and only different construction thereof from that of the first embodiment will be described in detail.

First of all, as shown in FIG. 6, a metal core 10 is supplied, and then, as shown in FIG. 7, insulating layers 20 are formed on the metal core 10.

Then, as shown in FIG. 8, metal layers 30 are formed on the insulating layers 20.

Then, as shown in FIG. 9, a first cavity 40 is formed by removing parts of the metal layer 30 and the insulating layer 20 to expose the top surface of the metal core 10. At this time, a first electrode 30a and a second electrode 30b electrically separated from each other may be formed on the insulating layer 20 adjacent to the first cavity 40.

After forming the first cavity 40, a second cavity 50 is formed on a position apart from the first cavity 40 at a predetermined distance to expose the top surface of the metal core 10. The second cavity 50 may be simultaneously formed when the first cavity 40 is formed.

Then, as shown in FIG. 14, a light emitting device 62 is directly mounted on the top surface of the metal core 10 in the first cavity 40. Then, a conductive layer 80 is formed on the top surface of the metal core 10 in the second cavity 50.

Herein, in accordance with the third embodiment of the present invention, the light emitting device 62 of the light emitting device package includes connection units 90 on a bottom surface. The connection units 90 may be composed of a bump, a pad or a solder ball or the like and electrically connected to the metal core 10 and the first electrode 30a respectively.

Meanwhile, as described above, when the insulating layer 20 and the metal layer 30 are formed on a bottom surface of the metal core 10, a third cavity ((referring to a reference numeral '45' in FIG. 5) may be formed by removing a part of the metal layer 30 and the insulating layer 20 formed on the bottom surface of the metal core 10 to expose the bottom surface of the metal core 10 on a position corresponding to the first cavity 40.

Fourth Embodiment

A Structure of a Light Emitting Device Package in Accordance with a Fourth Embodiment Hereinafter, a light emitting device package in accordance with a fourth embodiment of the present invention will be described in detail with reference to FIG. 15 to FIG. 17. Only, description for the same construction of the fourth embodiment as that of the first embodiment will be omitted and only different construction thereof from that of the first embodiment will be described in detail.

Figure 15:
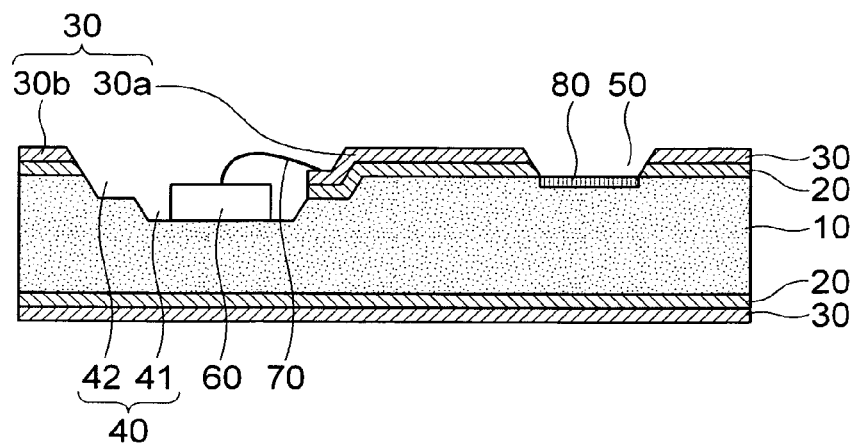
FIG. 15 is a cross-sectional view showing a structure of a light emitting device package in accordance with a fourth embodiment of the present invention.
Figure 16:
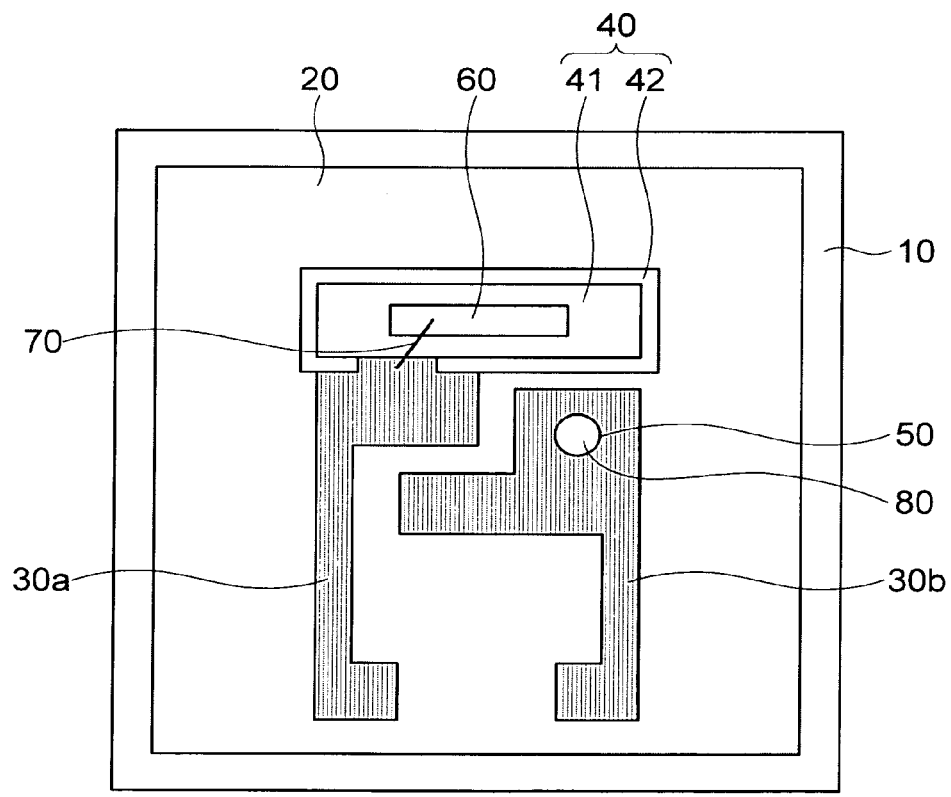
Figure 17:
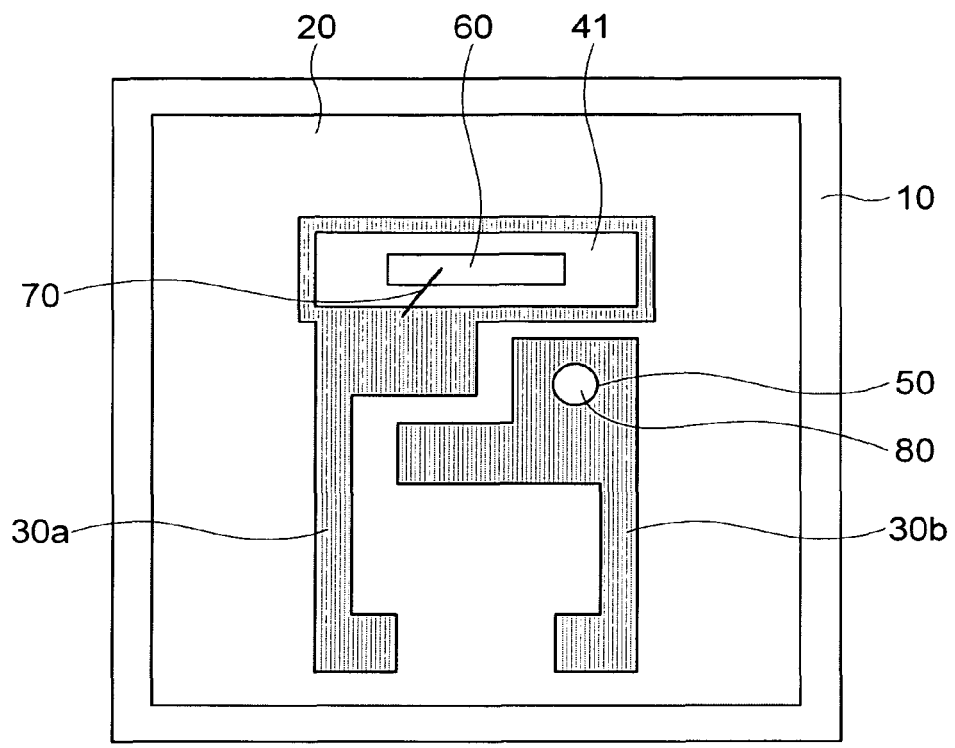

FIG. 15 is a cross-sectional view showing a structure of the light emitting device package in accordance with the fourth embodiment of the present invention, and FIG. 16 and FIG. 17 are plane-views showing the structure of the light emitting device package in accordance with the fourth embodiment of the present invention, wherein FIG. 16 is a view showing a first electrode formed on a partial inner surface of an upper cavity and FIG. 17 is a view showing a first electrode is formed on an entire inner surface of the upper cavity.

As shown in FIG. 15, in accordance with the four embodiment of the present invention, most of construction of the light emitting device package is the same as that of the above-mentioned light emitting device package in accordance with the first embodiment, only there is difference from the light emitting device package in accordance with the first embodiment in that a cavity 40 has a two-step structure with a lower cavity 41 and an upper cavity 42, a first electrode 30a electrically connected to a light emitting device 60 through a bonding wire 70 and an insulating layer 20 formed on a lower part of the first electrode 30a are extended to an inner surface of the upper cavity 42.

That is, in accordance with the fourth embodiment of the present invention, the light emitting device package includes a metal core 10 having the first cavity 40 composed of the lower cavity 41 and the upper cavity 42, the insulating layer 20 formed on a top surface of the metal core 10 excluding the lower cavity 41 and including the inner surface of the upper cavity 42; a metal layer 30 formed on the insulating layer 20 and having the a first electrode 30a and a second electrode 30b electrically separated from each other; a light emitting device 60 directly mounted on the metal core 10 in the lower cavity 41; and the bonding wire 70 electrically connecting the light emitting device 60 and the first electrode 30a.

At this time, when the metal core 10 has electrically (+) polarity, the first electrode 30a may have electrically (−) polarity.

The lower cavity 41 constituting the first cavity 40 may be formed in a size capable of mounting the light emitting device 60.

It is preferable that the first electrode 30a electrically connected to the light emitting device 60 through the bonding wire 70 is placed on a position adjacent to the first cavity 40 mounting the light emitting device 60 so as to facilitate a wire bonding process.

Particularly, in the fourth embodiment of the present invention, it is preferable that the first electrode 30a is extended to the inner surface of the upper cavity 42 and the bonding wire 70 is bonded on a portion of the first electrode 30a formed on the inner surface of the upper cavity 42.

Further, the bonding wire 70 is preferably formed in a lower height than that of a top surface of the metal layer 30 formed on the metal core 10 where the first cavity 40 is not formed.

Through the above construction, when molding material is filled in the first cavity 40 to protect the light emitting device 60 and the bonding wire 70, the molding material is filled to entirely cover the bonding wire 70, and therefore it is possible to prevent damage such as disconnection of the bonding wire 70 in case of handling by preventing the bonding wire 70 from being exposed to an upper part of the molding material.

Meanwhile, the first electrode 30a formed on the inner surface of the upper cavity 42 may be formed on a partial inner surface of the upper cavity 42 as shown in FIG. 16 or on an entire inner surface of the upper cavity 42 as shown in FIG. 17.

And, although not shown, in accordance with the fourth embodiment of the present invention like the modified embodiment of the first embodiment, the light emitting device package may further include an insulating layer 20 and a metal layer 30 sequentially formed on a bottom surface of the metal core 10 and having a third cavity (referring to a reference numeral '45' in FIG. 5) to expose the bottom surface of the metal core 10 on a position corresponding to the first cavity 40.

Further, in accordance with the fourth embodiment of the present invention, as described above, the light emitting device package may further include grooves 100 to expose the top surface of the metal core 10 on positions adjacent to the first cavity 40 by removing parts of the metal layer 30 and the insulating layer 20. And, protrusions 210 formed on a circumferential portion of a cap 200 are inserted into the grooves 100 and the cap 200 can be coupled to an upper part of the first cavity 40.

In accordance with the fourth embodiment of the present invention, the light emitting device package is capable of obtaining the same operation and effect and further preventing damage of the bonding wire 70 by forming the bonding wire 70 electrically connected to the light emitting device 60 inside a substrate not to be projected to an upper part of the substrate including the metal core 10 through the first cavity 40 with the two-step structure being formed on the metal core 10 and the light emitting device 60 being mounted in the lower cavity 41 of the first cavity 40, thereby enhancing reliability.

Modified Embodiment

A modified embodiment of the fourth embodiment will be described with reference to FIG. 18. Only, description for the same construction of the modified embodiment as that of the fourth embodiment will be omitted and only different construction thereof from that of the fourth embodiment will be described in detail.

Figure 18:
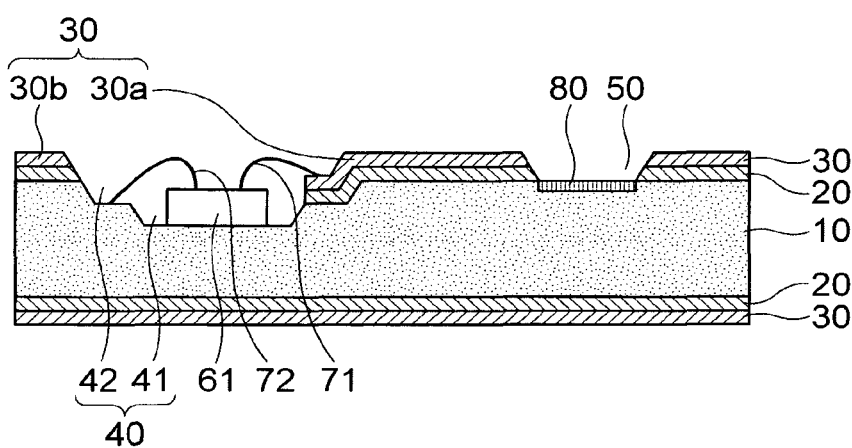
FIG. 18 is a cross-sectional view showing a modified embodiment of the light emitting device package in accordance with the fourth embodiment of the present invention.

FIG. 18 is a cross-sectional view showing a modified embodiment of the light emitting device package in accordance with the fourth embodiment of the present invention.

As shown in FIG. 18, in accordance with the modified embodiment of the fourth embodiment of the present invention, most of construction of the light emitting device package is the same as that of the above-mentioned light emitting device package in accordance with the fourth embodiment, only there is difference from the light emitting device package in accordance with the fourth embodiment in that a light emitting device 61 has a parallel electrode structure not a vertical electrode structure, one electrode (not shown) of the light emitting device 61 is electrically connected to a first electrode 30a through a first boding wire 71 and the other electrode (not shown) thereof is electrically connected to a portion of a metal core 10 where an insulating layer 20 is not formed through a second bonding wire 72.

At this time, it is preferable that when the metal core 10 has electrically (+) polarity, the first electrode 30a has electrically (−) polarity.

And, in accordance with the modified embodiment of the fourth embodiment, as described above, the light emitting device package may further include an insulating layer 20 and a metal layer 30 sequentially formed on a bottom surface of the metal core 10 and having a third cavity (referring to a reference numeral '45' in FIG. 5) to expose the bottom surface of the metal core 10 on a position corresponding to the first cavity 40.

Further, in accordance with the modified embodiment of the fourth embodiment, the light emitting device package may further include grooves 100 formed on positions adjacent to the first cavity 40 to expose the top surface of the metal core 10, and a cap 200 coupled to an upper part of the first cavity 40 by inserting protrusions 210 formed on a circumferential portion of the cap 200 into the grooves 100.

Method of Manufacturing the Light Emitting Device Package in Accordance with the Fourth Embodiment Hereinafter, a method of manufacturing the light emitting device package in accordance with the fourth embodiment of the present invention will be described in detail with reference to FIG. 15. Only, description for the same construction of the fourth embodiment as that of the first embodiment will be omitted and only different construction thereof from that of the first embodiment will be described in detail.

Referring to FIG. 15, first of all, a metal core 10 with a first cavity 40 composed of a lower cavity 41 and an upper cavity 42 is supplied.

Then, an insulating layer 20 is formed on a top surface of the metal core 10 excluding the lower cavity 41 and including an inner surface of the upper cavity 42, and then a metal layer 30 having a first electrode 30a and a second electrode 30b electrically separated from each other is formed on the insulating layer 20.

The insulating layer 20 may be formed on a partial inner surface or an entire inner surface of the upper cavity 42. Further, the first electrode 30a formed on the insulating layer 20 may be formed to the inner surface of the upper cavity 42 with being placed on a position adjacent to the first cavity 40. That is, the first electrode 30a may be formed on the insulation layer 20 formed on the partial inner surface or the entire inner surface of the upper cavity 42.

Meanwhile, in the present embodiment, as described above, the insulating layer 20 and the metal layer 30 are sequentially formed on the metal core 10 on which the lower cavity 41 and the upper cavity 42 are formed, however, after forming the upper cavity 42 on the metal core 10, the insulating layer 20 and the metal layer 30 may be formed on the metal core 10 on which the upper cavity 42 is formed, and then the lower cavity 41 may be formed by etching a part of the metal layer 30, insulating layer 20 and metal core 10. The present invention is not limited to a formation order of the lower cavity 41 and the upper cavity 42 of the metal core 10, the insulating layer 20 and the metal layer 30.

Then, a second cavity 50 is formed by removing a part of the metal layer 30 and the insulating layer 20 formed on a position apart from the first cavity 40 at a predetermined distance to expose the top surface of the metal core 10. Then, a conductive layer 80 is formed on the top surface of the metal core 10 in the second cavity 50.

Then, a light emitting device 60 is directly mounted on the metal core 10 in the lower cavity 41, and then the light emitting device 60 and the first electrode 30a are electrically connected through a bonding wire 70.

The bonding wire 70 is preferably formed in a lower height than that of a top surface of the metal layer 30 formed on the metal core where the first cavity 40 is not formed.

Herein, before or after connecting the light emitting device 60 and the first electrode 30a through the bonding wire 70, as shown in FIG. 18, the light emitting device 61 and a portion of the metal core 10 where the insulating layer 20 is not formed may be electrically connected through a second bonding wire 72.

Then, although not shown in the drawing, molding material (not shown) is filled in the first cavity 40 to protect the light emitting device 60 and the bonding wire 70. At this time, in accordance with the fourth embodiment of the present invention, there is an advantage to prevent damage such as disconnection of the bonding wire 70 in case of handling by preventing the bonding wire 70 from being exposed to an upper part of the molding material through the molding material being filled to entirely cover the bonding wire 70.

As described above, in accordance with the preferable embodiments of the present invention, the light emitting device package and the method of manufacturing the same are capable of being applicable to a high heat generating device by improving a heat discharging performance through effective discharging of heat generated from the light emitting device to the outside through the metal core by directly mounting the light emitting device on the metal core made of material with the high thermal conductivity such as aluminum.

And, in accordance with the present invention, the metal core is used not only as the substrate mounting the light emitting device but also as one electric passage applying the power to the light emitting device, thereby reducing a manufacturing cost by simplifying components and manufacturing processes of the light emitting device package.

Further, when forming the cap for protecting the light emitting device or for playing a role of a lens on the metal core mounting the light emitting device, it is possible to easily array the position of the cap and stably fix the cap by forming the grooves to expose the metal core and inserting the protrusions formed on the circumferential portion of the cap into the grooves.

In addition, in accordance with the present invention, it is possible to prevent damage of the bonding wire and improve the reliability of the light emitting device package by forming the bonding wire electrically connected to the light emitting device inside the substrate not to be projected to the upper part of the substrate including the metal core through the cavity with the two-step structure composed of the lower cavity and the upper cavity being formed on the metal core and the light emitting device being mounted in the lower cavity.

As described above, although a few preferable embodiments of the present invention have been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:

1. A method of manufacturing a light emitting device package comprising the steps of:
    forming an insulating layer on a metal core;
    forming a metal layer on the insulating layer;
    forming a first cavity to expose a top surface of the metal core by removing parts of the metal layer and the insulating layer;
    forming a second cavity to expose the top surface of the metal core on a position apart from the first cavity at a predetermined distance by removing parts of the metal layer and the insulating layer;
    directly mounting a light emitting device on the top surface of the metal core in the first cavity; and
    after forming the second cavity, forming a conductive layer on the top surface of the metal core in the second cavity.

2. The method according to claim 1, wherein the conductive layer is made of any one selected from a group consisting of Au, Ag, Ni and Cu.

3. The method according to claim 1, wherein the conductive layer is composed of a metal plating layer or a metal paste.

4. A method of manufacturing a light emitting device package comprising the steps of:
    forming an insulating layer on a metal core;
    forming a metal layer on the insulating layer;
    forming a first cavity to expose a top surface of the metal core by removing parts of the metal layer and the insulating layer;
    directly mounting a light emitting device on the top surface of the metal core in the first cavity and electrically connecting an electrode of the light emitting device to the metal core in the first cavity; and
    sequentially forming a second insulating layer and a second metal layer on a bottom surface of the metal core, and then forming a third cavity to expose the bottom surface of the metal core on a position corresponding to the first cavity by removing parts of the second metal layer and the second insulating layer.

5. A method of manufacturing a light emitting device package comprising the steps of:
    forming an insulating layer on a metal core;
    forming a metal layer on the insulating layer;
    forming a first electrode and a second electrode electrically separated from each other on the insulating layer adjacent to a first cavity by forming the first cavity to expose a top surface of the metal core through removal of parts of the metal layer and the insulating layer;
    directly mounting a light emitting device on the top surface of the metal core in the first cavity; and
    electrically connecting the light emitting device and the first electrode through a first bonding wire and electrically connecting the light emitting device and the metal core through a second bonding wire.

6. The method according to claim 5, wherein the light emitting device is electrically connected to the metal core exposed by the first cavity through the second bonding wire.

7. The method according to claim 5, wherein after forming the first cavity, further comprising the step of:
    forming a second cavity to expose the top surface of the metal core on a position apart from the first cavity at a predetermined distance by removing parts of the metal layer and the insulating layer.

8. The method according to claim 5, further comprising the step of:
    sequentially forming a second insulating layer and a second metal layer on a bottom surface of the metal core, and then forming a third cavity to expose the bottom surface of the metal core on a position corresponding to the first cavity by removing parts of the second metal layer and the second insulating layer.

9. The method according to claim 5, wherein the light emitting device has a parallel electrode structure, the first bonding wire electrically connects an electrode on a top surface of the light emitting device to the first electrode; and the second bonding wire electrically connects another electrode on the top surface of the light emitting device to the metal core.

10. The method according to claim 5, wherein the electrically connecting the light emitting device and the metal core through the second bonding wire comprises electrically connecting the light emitting device for applying power to the light emitting device via the metal core.

11. A method of manufacturing a light emitting device package comprising the steps of:
    forming an insulating layer on a metal core;
    forming a metal layer on the insulating layer;
    forming a first electrode and a second electrode electrically separated from each other on the insulating layer adjacent to a first cavity by forming the first cavity to expose a top surface of the metal core through removal of parts of the metal layer and the insulating layer;

forming a second cavity to expose the top surface of the metal core on a position apart from the first cavity at a predetermined distance by removing parts of the metal layer and the insulating layer;

directly mounting a light emitting device on the top surface of the metal core in the first cavity;

electrically connecting the light emitting device and the first electrode through a first bonding wire and electrically connecting the light emitting device and the second electrode through a second bonding wire; and after forming the second cavity, forming a conductive layer on the top surface of the metal core in the second cavity.

12. A method of manufacturing a light emitting device package comprising the steps of:

forming an insulating layer on a metal core;

forming a metal layer on the insulating layer;

forming a first electrode and a second electrode electrically separated from each other on the insulating layer adjacent to a first cavity by forming the first cavity to expose a top surface of the metal core through removal of parts of the metal layer and the insulating layer;

directly mounting a light emitting device including connection units electrically connected to the metal core and the first electrode respectively on a bottom surface and on the top surface of the metal core in the first cavity;

forming a second cavity to expose the top surface of the metal core on a position apart from the first cavity at a predetermined distance by removing parts of the metal layer and the insulating layer; and after forming the second cavity, forming a conductive layer on the top surface of the metal core in the second cavity.

13. A method of manufacturing a light emitting device package comprising the steps of:

forming an insulating layer on a metal core;

forming a metal layer on the insulating layer;

forming a first electrode and a second electrode electrically separated from each other on the insulating layer adjacent to a first cavity by forming the first cavity to expose a top surface of the metal core through removal of parts of the metal layer and the insulating layer; and directly mounting a light emitting device having connection units on a bottom surface of the light emitting device facing the metal core by electrically connecting the connection units to the metal core and the first electrode, respectively; and sequentially forming a second insulating layer and a second metal layer on a bottom surface of the metal core, and then forming a third cavity to expose the bottom surface of the metal core on a position corresponding to the first cavity by removing parts of the second metal layer and the second insulating layer.

14. A method of manufacturing a light emitting device package comprising the steps of:

supplying a metal core including a first cavity composed of a lower cavity and an upper cavity;

forming an insulating layer on a top surface of the metal core having the first cavity, the insulating layer being formed on portions of the top surface of the metal core excluding the lower cavity and including an inner surface of the upper cavity;

forming a metal layer including a first electrode and a second electrode electrically separated from each other on the insulating layer on the metal core having the first cavity;

directly mounting a light emitting device on the metal core in the lower cavity; and electrically connecting the light emitting device and the first electrode through a bonding wire.

15. The method according to claim 14, wherein in the step of forming the insulating layer, the insulating layer is formed on a partial inner surface or an entire inner surface of the upper cavity.

16. The method according to claim 14, wherein in the step of forming the metal layer, the first electrode is placed on a position adjacent to the first cavity and formed to an inner surface of the upper cavity.

17. The method according to claim 14, wherein in the step of electrically connecting through the bonding wire, the bonding wire is formed in a lower height than that of a top surface of the metal layer formed on the metal core where the first cavity is not formed.

18. The method according to claim 14, further comprising the step of:

forming a second cavity to expose the top surface of the metal core on a position apart from the first cavity at a predetermined distance.

19. The method according to claim 14, wherein before or after electrically connecting through the bonding wire, further comprising the step of:

electrically connecting the light emitting device and a portion of the metal core where the insulating layer is not formed through a second bonding wire.

20. The method according to claim 14, further comprising electrically connecting an electrode of the light emitting device to the metal core in the first cavity.

21. The method according to claim 20, wherein the electrically connecting the electrode of the light emitting device to the metal core in the first cavity comprises electrically connecting the electrode for applying power to the light emitting device via the metal core in the first cavity.

22. The method according to claim 20, wherein the light emitting device has a vertical electrode structure, and the electrode of the light emitting device is directly electrically connected to the metal core in the first cavity.

23. The method according to claim 20, wherein the electrically connecting the electrode of the light emitting device to the metal core in the first cavity comprises electrically connecting a bonding wire between the electrode of the light emitting device and the metal core in the upper cavity of the first cavity.

24. The method according to claim 20, wherein the electrically connecting the electrode of the light emitting device to the metal core in the first cavity comprises electrically connecting an electrode formed on a lower surface of the light emitting device to the metal core in the lower cavity of the first cavity.

25. A method of manufacturing a light emitting device package comprising the steps of:

forming an insulating layer on a metal core;

forming a metal layer on the insulating layer;

forming a first cavity to expose a top surface of the metal core by removing parts of the metal layer and the insulating layer; and directly mounting a light emitting device on the top surface of the metal core in the first cavity and electrically connecting an electrode of the light emitting device to the metal core in the first cavity, wherein the electrically connecting the electrode of the light emitting device to the metal core in the first cavity comprises electrically connecting the electrode for applying power to the light emitting device via the metal core in the first cavity.

26. A method of manufacturing a light emitting device package comprising the steps of:
   forming an insulating layer on a metal core;
   forming a metal layer on the insulating layer;
   forming a first electrode and a second electrode electrically separated from each other on the insulating layer adjacent to a first cavity by forming the first cavity to expose a top surface of the metal core through removal of parts of the metal layer and the insulating layer; and
   directly mounting a light emitting device having connection units on a bottom surface of the light emitting device facing the metal core by electrically connecting the connection units to the metal core and the first electrode, respectively,
   wherein the electrically connecting the connection units to the metal core and the first electrode comprises electrically connecting the connection units for applying power to the light emitting device via the metal core.

27. A method of manufacturing a light emitting device package comprising the steps of:
   forming an insulating layer on a metal core;
   forming a metal layer on the insulating layer;
   forming a first electrode and a second electrode electrically separated from each other on the insulating layer adjacent to a first cavity by forming the first cavity to expose a top surface of the metal core through removal of parts of the metal layer and the insulating layer; and
   directly mounting a light emitting device having connection units on a bottom surface of the light emitting device facing the metal core by electrically connecting the connection units to the metal core and the first electrode, respectively,
   wherein the electrically connecting the connection units to the metal core and the first electrode comprises electrically connecting the connection units of the light emitting device having a flip chip structure to the metal core and the first electrode.

28. A method of manufacturing a light emitting device package comprising the steps of:
   supplying a metal core including a first cavity composed of a lower cavity and an upper cavity;
   forming an insulating layer on a top surface of the metal core excluding the lower cavity and including an inner surface of the upper cavity;
   forming a metal layer including a first electrode and a second electrode electrically separated from each other on the insulating layer;
   directly mounting a light emitting device on the metal core in the lower cavity;
   electrically connecting the light emitting device and the first electrode through a bonding wire;
   forming a second cavity to expose the top surface of the metal core on a position apart from the first cavity at a predetermined distance; and
   after forming the second cavity, forming a conductive layer on the top surface of the metal core in the second cavity.

* * * * *